US012573840B2

(12) United States Patent
Chavan et al.

(10) Patent No.: US 12,573,840 B2
(45) Date of Patent: Mar. 10, 2026

(54) DI/DT SENSOR FOR FAST DETECTION OF SHORT CIRCUIT FAULTS WITH A SOLID-STATE CIRCUIT BREAKER

(71) Applicant: ABB Schweiz AG, Baden (CH)

(72) Inventors: Govind S. Chavan, Garner, NC (US); Chunmeng Xu, Raleigh, NC (US); Zhou Dong, Raleigh, NC (US); Pietro Cairoli, Cary, NC (US)

(73) Assignee: ABB Schweiz AG, Baden (CH)

( * ) Notice: Subject to any disclaimer, the term of this patent is extended or adjusted under 35 U.S.C. 154(b) by 142 days.

(21) Appl. No.: 18/504,573

(22) Filed: Nov. 8, 2023

(65) Prior Publication Data

US 2025/0149880 A1 May 8, 2025

(51) Int. Cl.
| | |
|---|---|
| *H02H 7/00* | (2006.01) |
| *G01R 15/18* | (2006.01) |
| *G01R 15/20* | (2006.01) |
| *H02H 1/00* | (2006.01) |
| *H02H 7/26* | (2006.01) |

(52) U.S. Cl.
CPC .......... *H02H 7/268* (2013.01); *G01R 15/181* (2013.01); *G01R 15/202* (2013.01); *H02H 1/0007* (2013.01)

(58) Field of Classification Search
None
See application file for complete search history.

(56) References Cited

U.S. PATENT DOCUMENTS

| | | | |
|---|---|---|---|
| 5,687,049 A | 11/1997 | Mangtani | |
| 6,366,076 B1 | 4/2002 | Karrer et al. | |
| 6,487,057 B1 * | 11/2002 | Natili ................... | H01H 71/123 |
| | | | 361/114 |
| 6,577,138 B2 | 6/2003 | Zuercher et al. | |

(Continued)

FOREIGN PATENT DOCUMENTS

| | | |
|---|---|---|
| CN | 1402404 A | 3/2003 |
| CN | 101702506 A | 5/2010 |

(Continued)

OTHER PUBLICATIONS

Lem City, "Split Core Rogowski Coil," B22 series datasheet downloaded from the Internet at https://www.lem.com/sites/default/files/products_datasheets/art-b22-dxxxxx_series.pdf on Nov. 7, 2023, 12 pp. (Jan. 18, 2018).

(Continued)

*Primary Examiner* — Stephen W Jackson
(74) *Attorney, Agent, or Firm* — Fitch Even Tabin & Flannery LLP

(57) ABSTRACT

Embodiments of the present disclosure provide an electrical circuit and a method for detecting short circuit faults with a solid-state circuit breaker (SSCB) in a direct current (DC) electrical system. The electrical circuit includes a first sensor configured to detect a fault current of an electrical system, and the first sensor is configured for installation on a main current path of an SSCB pole; a second sensor configured to detect a derivative of the fault current of the electrical system with respect to time, and the second sensor is configured for installation on the main current path of the SSCB pole; and an analog circuit, and an output of the first sensor and an output of the second sensor are connected to the analog circuit.

20 Claims, 11 Drawing Sheets

400

(56) References Cited

U.S. PATENT DOCUMENTS

| | | | |
|---|---|---|---|
| 6,731,116 | B2 | 5/2004 | Yamamoto et al. |
| 11,264,790 | B2 | 3/2022 | Cairoli et al. |
| 2003/0107380 | A1 | 6/2003 | Leprettre et al. |
| 2025/0149880 | A1* | 5/2025 | Chavan .................. H02H 7/268 |

FOREIGN PATENT DOCUMENTS

| | | | |
|---|---|---|---|
| CN | 201886112 | U | 6/2011 |
| DE | 102008030411 | A1 | 1/2009 |
| EP | 1110287 | B1 | 4/2002 |
| EP | 0993695 | B1 | 3/2006 |

OTHER PUBLICATIONS

Dubickas et al., "High-Frequency Model of the Rogowski Coil With a Small Number of Turns," *IEEE Transactions on Instrumentation and Measurement*, 56(6): 2284-2288 (2007).

Rodrigues et al., "Robust 5 kA, 1 kV Solid-State DC Circuit Breaker for Next Generation Marine Power Systems," *IEEE Electric Ship Technologies Symposium (ESTS)*, 7 pp. (Aug. 3, 2021).

Samimi et al., "The Rogowski Coil Principles and Applications: A Review," *IEEE Sensors Journal*, 15(2): 651-658 (Feb. 2015).

Wang et al., "Analysis on the Transfer Characteristics of Rogowski-Coil Current Transformer and Its Influence on Protective Relaying," *Energy and Power Engineering*, 5(04): 1324-1329 (Jul. 2013).

Zhao et al., "Planar Embedded Pick-Up Coil Sensor for Power Electronic Modules," *Nineteenth Annual IEEE Applied Power Electronics Conference and Exposition*, 2004 (2004).

Chavan et al., "Coordination of Solid-State Circuit Breakers for DC Grids Under High-Fault-di/dt Conditions," *IEEE Energy Conversion Congress and Exposition (ECCE)*, 5 pp. (Oct. 9, 2022).

Karrer et al., "A new current measuring principle for power electronic applications," *11th International Symposium on Power Semiconductor Devices and ICs. ISPSD'99 Proceedings, IEEE*, 279-282 (May 26, 1999).

European Patent Office, Extended European Search Report in European Patent Application No. 24211227.4, 9 pp. (Mar. 31, 2025).

* cited by examiner

700

710 Top Conductor

720 Insulation

730 Alumina Substrate

740 Insulation

750 Bottom Conductor

732 Top Trace

734

736

702

704

DI/DT SENSOR FOR FAST DETECTION OF SHORT CIRCUIT FAULTS WITH A SOLID-STATE CIRCUIT BREAKER

FIELD

Generally, the present disclosure relates to short-circuit and overload protections for a solid-state circuit breaker (SSCB) and, more specifically, to a circuit and method for fast detection of short circuit faults with SSCB.

BACKGROUND

Designs of circuit breakers for direct current (DC) electrical systems are more challenging than for alternating current (AC) electrical systems due to DC electrical systems' high fault current derivative with respect to time (di/dt) and lack of zero-crossing current. For example, control circuitries for DC electrical systems usually delay in reacting due to high fault di/dt, which causes a peak fault current to exceed a default trip current threshold that is set for the particular control circuit. In particular, conventional mixed-signal analog fault detection circuits of DC electrical systems use the same circuit path for detecting fault current as well as calculating fault di/dt. Results of such fault detection are easily affected by any inaccuracies, signal distortions, and/or propagation delays caused by a current sensor, a filter, and/or an onboard differentiator circuit of the fault detection circuit. In addition, relying on a single source, e.g., a current sensor, for calculating both fault current and fault di/dt introduces a single point-of-failure in the detection circuit.

Therefore, a need exists for a more accurate and more reliable mixed-signal protection scheme for detecting high fault di/dt within DC electrical systems so as to provide comprehensive protection for different fault di/dt situations.

SUMMARY

In an exemplary embodiment, the present disclosure provides an electrical circuit for detecting short circuit faults with a solid-state circuit breaker (SSCB). The electrical circuit includes:

a first sensor configured to detect a fault current of an electrical system, wherein the first sensor is configured for installation on a main current path of an SSCB pole; a second sensor configured to detect a derivative of the fault current of the electrical system with respect to time, wherein the second sensor is configured for installation on the main current path of the SSCB pole; and an analog circuit, wherein an output of the first sensor and an output of the second sensor are connected to the analog circuit.

The second sensor is a Rogowski coil current sensor. The Rogowski coil current sensor is designed as a printed circuit board (PCB). The PCB includes a window, which the main current path of the SSCB pole passes through.

The second sensor is an inductor.

The first sensor is a Hall-effect current sensor.

The analog circuit includes a subtractor and/or an adder that combines the output of the first sensor, the output of the second sensor, and a trip current threshold to evaluate whether a sum of the outputs of the first and second sensors exceeds the trip current threshold. An output of the subtractor and/or the adder delivers an adjusted trip current threshold based on the derivative of the fault current with respect to time. The analog circuit further includes a comparator that determines whether the fault current exceeds the adjusted trip current threshold, based on which a decision to trip the SSCB is made.

The analog circuit further includes an instrumentation amplifier, wherein a gain of the instrumentation amplifier is adjusted based on the derivative of the fault current with respect to time to increase or decrease a compensation for the derivative of the fault current with respect to time.

In another exemplary embodiment, the present disclosure provides an electrical circuit on a printed circuit board (PCB) for detecting short circuit faults with an SSCB. The electrical circuit is configured for connection to a first sensor configured to detect a fault current of an electrical system. The electrical circuit on the PCB includes:

a second sensor configured to detect a derivative of the fault current with respect to time of the electrical system, wherein the second sensor is connected to a main current path of an SSCB pole; and an analog circuit, wherein an output of the first sensor and an output of the second sensor are connected to the analog circuit.

The second sensor is a Rogowski coil current sensor. The Rogowski coil current sensor is designed as a PCB-based Rogowski coil current sensor and embedded into the electrical circuit on the PCB. The PCB-based Rogowski coil current sensor is customized to detect a derivative of a secondary fault current output of the first sensor with respect to time.

The Rogowski coil current sensor is a planar Rogowski coil current sensor.

The first sensor is a Hall-effect current sensor.

The analog circuit includes a subtractor and/or an adder that combines the output of the first sensor, the output of the second sensor, and a trip current threshold to evaluate whether a sum of the outputs of the first and second sensors exceeds the trip current threshold. An output of the subtractor and/or the adder delivers an adjusted trip current threshold based on the derivative of the fault current with respect to time. The analog circuit further includes a comparator that determines whether the fault current exceeds the adjusted trip current threshold, based on which a decision to trip the SSCB is made.

The analog circuit further includes an instrumentation amplifier, wherein a gain of the instrumentation amplifier is adjusted based on the derivative of the fault current with respect to time to increase or decrease a compensation for the derivative of the fault current with respect to time.

The electrical circuit on the PCB further includes an integrator that accumulates the derivative of the fault current with respect to time detected by the second sensor over a defined time and produces a representative output as a backup current for the fault current detected by the first sensor.

In another exemplary embodiment, the present disclosure provides a method of adjusting a trip current threshold for an electrical circuit for detecting short circuit faults with an SSCB. The method includes:

detecting a fault current using a first sensor; detecting a derivative of the fault current with respect to time using a second sensor; evaluating whether a sum of the detected fault current and the detected derivative of the fault current with respect to time exceeds the trip current threshold to obtain an adjusted trip current threshold; comparing the detected fault current with the adjusted trip current threshold; and making a tripping decision for the SSCB based on a result of the comparison.

BRIEF DESCRIPTION OF THE DRAWING(S)

FIG. 1 is a schematic diagram of a conventional mixed-signal analog fault detection circuit for detecting short circuit faults with a solid-state circuit breaker (SSCB) in a direct current (DC) electrical system;

FIG. 2 includes plots showing the impact of a di/dt-based compensation scheme on peak fault current of a DC electrical system;

FIG. 3 includes transients of a di/dt-based compensation scheme with different fault di/dt of a DC electrical system;

Figure 9:
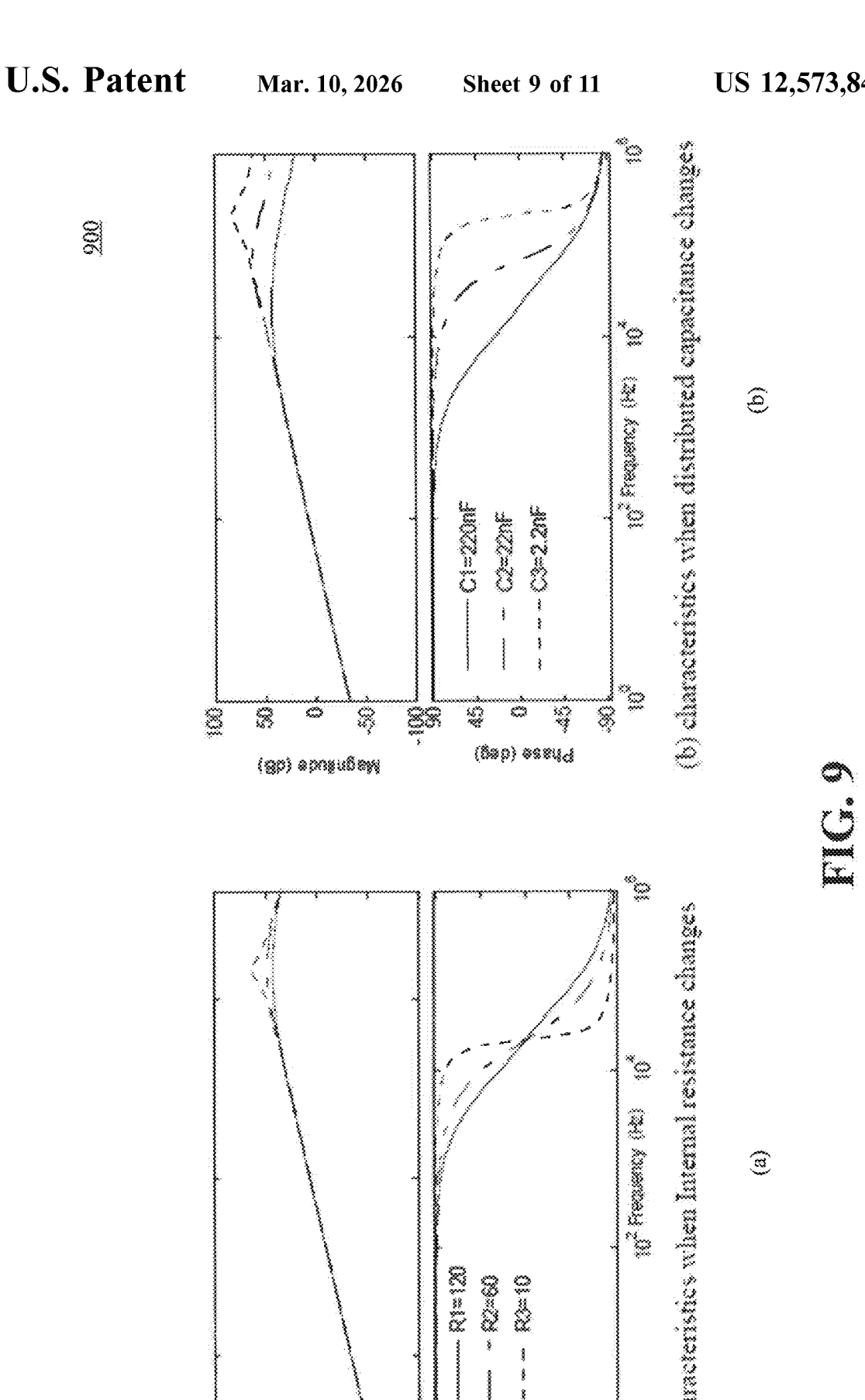
Figure 10:
Figure 11:
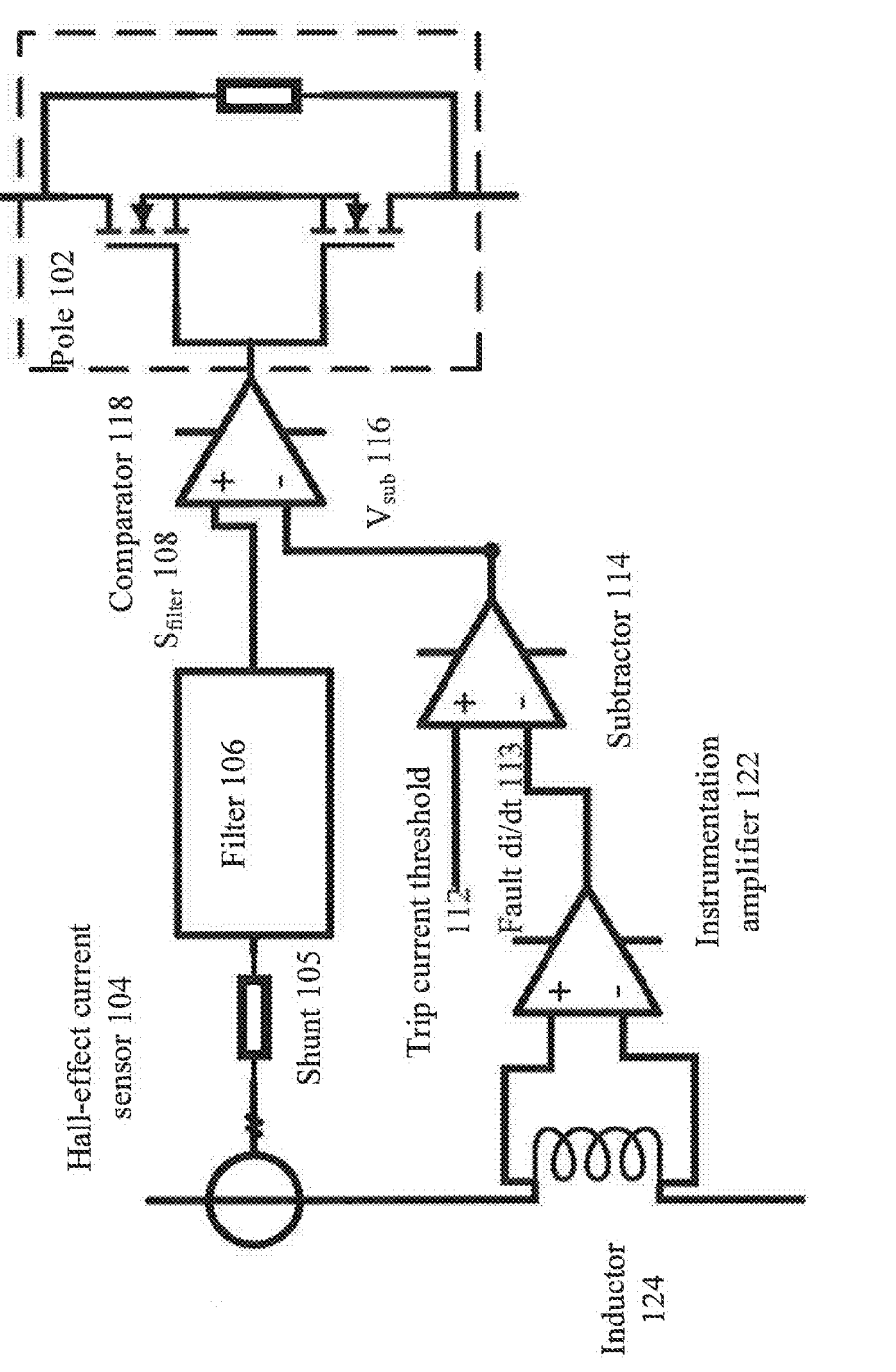

FIGS. 9(*a*) and 9(*b*) are Bode plots of a gain of an exemplary Rogowski coil current sensor;

FIG. 10 is an exemplary hardware configuration of a PCB-based planar Rogowski coil that is embedded into a mixed-signal analog fault detection circuit for detecting short circuit faults with an SSCB in a DC electrical system according to an embodiment of the present disclosure; and FIG. 11 is a schematic diagram of a mixed-signal analog fault detection circuit for detecting short circuit faults with an SSCB in a DC electrical system according to an embodiment of the present disclosure.

DETAILED DESCRIPTION

Exemplary embodiments of the present disclosure provide an electrical circuit for detecting short circuit faults with a solid-state circuit breaker (SSCB) in a direct current (DC) electrical system. Exemplary embodiments of the present disclosure further provide an electrical circuit in a printed circuit board (PCB) for detecting short circuit faults with an SSCB in a DC electrical system. The electrical circuit is configured for connection to a first sensor. Exemplary embodiments of the present disclosure further provide a method of adjusting a trip current threshold for an electrical circuit for detecting short circuit faults with an SSCB in a DC electrical system.

DC circuit breaker designs can be more challenging than alternating current (AC) circuit breaker designs in terms of dealing with high fault current derivative with respect to time (di/dt). In an AC circuit, the fault current rise time is limited to about one-fourth of an AC line frequency, whereas the fault di/dt in a DC circuit is limited by the fault inductance, which can be small based on the distance between the fault and its source. Further, because there is no zero-crossing current in a DC circuit, fault current arc does not extinguish by itself like in an AC circuit at an end of each half-cycle.

Conventional mixed-signal analog fault detection circuits pose two major problems in DC electrical systems due to use of the same circuit path for detecting both fault current and fault di/dt. First, calibration of fault di/dt is easily affected by inaccuracies, signal distortions, and/or propagation delays caused by various components of such fault detection circuits. Second, a single point-of-failure is introduced into such fault detection circuits, as both fault current and fault di/dt are detected by the same circuit path.

Exemplary embodiments of the present disclosure provide an electrical circuit including a second sensor independently measuring fault di/dt for detecting short circuit faults with a direct current circuit breaker (DCCB), for example, an SSCB. The second sensor provides low latency and high accuracy for rapid fault detection through an analog and digital trip circuit for DC SSCB. Further, the second sensor can be integrated with a first sensor, e.g., a DC current sensor, and an analog processing circuit of the electrical circuit. Furthermore, the second sensor can be an embedded printed circuit board (PCB) design that detects secondary fault di/dt from a first sensor, e.g., an external Hall-effect current sensor, for the electrical circuit.

Figure 1:
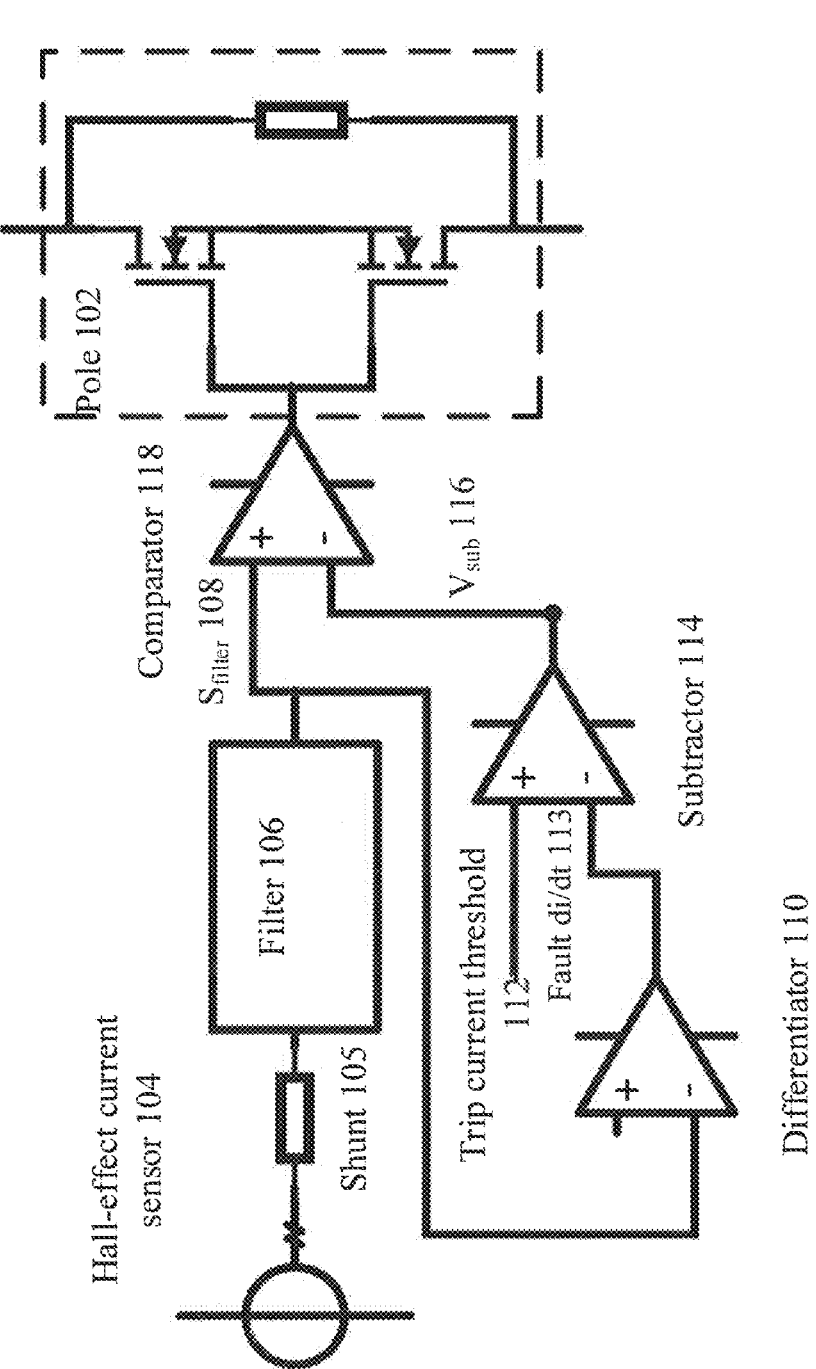

FIG. 1 is a schematic diagram of a conventional mixed-signal analog fault detection circuit for detecting short circuit faults with a solid-state circuit breaker (SSCB) in a direct current (DC) electrical system.

The conventional mixed-signal analog fault detection circuit 100 is tasked with detecting fault current, also known as short-circuit current, for the SSCB. The fault detection circuit 100 includes a sensor 104 that detects the fault current of a DC circuit or system. For example, the sensor 104 is a Hall-effect current sensor. The detected fault current is diverted through a shunt 105 towards a filter 106. A filtered fault current, represented by a signal $S_{filter}$ 108, is provided to a comparator 118, and to a differentiator 110. That is, a first input of the comparator 118 receives a detected fault current magnitude of the DC circuit or system.

The differentiator 110 produces or calculates an output approximately proportional to the rate of change of the filtered fault current represented by the signal $S_{filter}$ 108, i.e., a fault di/dt 113. This fault di/dt 113 is used to compensate or adjust a trip current threshold 112 through a subtractor 114. For example, the trip current threshold 112 is provided to a first input of the subtractor 114, and the fault di/dt 113 is provided to a second input of the subtractor 114. An output of the subtractor 114, i.e., the compensated or adjusted trip current threshold, which is represented by a signal $V_{sub}$ 116 is provided to the comparator 118. That is, a second input of the comparator 118 receives the compensated or adjusted trip current threshold of the DC circuit or system.

In other words, the trip current threshold 112 is compensated or adjusted as a function of the fault di/dt 113. For example, when there is no fault di/dt 113 in the filtered fault current represented by the signal $S_{filter}$ 108, the trip current threshold 112 remains as it is. This trip current threshold 112 may be preset by a manufacturer of the SSCB by adjusting a resistor divider, additionally and/or alternatively, by a user by adjusting a potentiometer, i.e., a variable resistor, through a knob or a software code for various application needs. In this situation, the comparator 118 compares the filtered fault current represented by the signal $S_{filter}$ 108 with the trip current threshold 112 represented by the signal $V_{sub}$ 116, and a corresponding output is delivered to a pole 102 of the SSCB. Accordingly, the SSCB is tripped. When the fault di/dt 113 in the filtered fault current represented by the signal $S_{filter}$ 108 has some value, the trip current threshold 112 is adjusted or reduced by the value of the fault di/dt 113 through the subtractor 114. In this situation, the comparator 118 compares the filtered fault current represented by the signal $S_{filter}$ 108 with the adjusted or reduced trip current threshold 112 represented by the signal $V_{sub}$ 116, and a corresponding output is delivered to the pole 102 to trip the SSCB. In sum, the SSCB is tripped at a higher trip current threshold 112 when the fault di/dt 113 is lower, or at a lower trip current threshold 112 when the fault di/dt 113 is higher. As such, the trip current threshold 112 for the SSCB is adjusted based on the hardware of the fault detection circuit 100, i.e., the hardware of the purely analog circuitry, to deal with any delays in response to any changes of the fault di/dt 113.

Compared to a software-based trip current threshold adjustment controlled by a microcontroller, the above-introduced hardware-based trip current threshold adjustment is faster so that delays are reduced. For example, for a software-based trip current threshold adjustment, the conventional mixed-signal analog fault detection circuit 100 as shown in FIG. 1 detects fault current, and provides this fault current to an analog-to-digital converter (ADC) of a microcontroller. The microcontroller then compares the detected fault current to a software-based threshold. If the detected fault current crosses the software-based threshold, the microcontroller generates a tripping command to the SSCB. This decision-making process takes a lot of time. In the event the fault di/dt is high, there is not sufficient time available before the fault current exceeds the capabilities of the SSCB.

The basic idea of the fault detection circuit 100 is to make up delay time needed for the foregoing described decision-making process, either for software-based trip current threshold adjustment or for the hardware-based trip current threshold adjustment. For example, the peak fault current $I_{peak}$ in the SSCB can be expressed as follows:

$$I_{peak} = I_{th} + \frac{di}{dt} \times \delta t \tag{1}$$

where $I_{th}$ is a default trip current threshold, for example, the trip current threshold 112 as shown in FIG. 1 and also known as the fault overcurrent threshold, in amperes, $$\frac{di}{dt}$$

is the fault di/dt in amperes per microsecond, and $\delta t$ is the delay in the fault detection circuit 100 in microsecond.

As shown, a lower delay time $\delta t$ of the fault detection circuit 100 helps in controlling $I_{peak}$ to a desired level. Further, the default trip current threshold $I_{th}$ that is set on the control board of the microcontroller can be adjusted over the rise of the fault di/dt in order to control $I_{peak}$ to a desired level. Or, the fault di/dt may be estimated by using the analog differentiator, such as the differentiator 110 as shown in FIG. 1. The default trip current threshold $I_{th}$ can then be adjusted to an adjusted trip current threshold $\widehat{I_{th}}$ as a function of the estimated di/dt as follows:

$$\widehat{I_{th}} = I_{th} - k \times \hat{y} \tag{2}$$

where $\hat{y}$ represents a circuit of the differentiator, and k represents a parameter for adjusting the default trip current threshold $I_{th}$.

Figure 2:
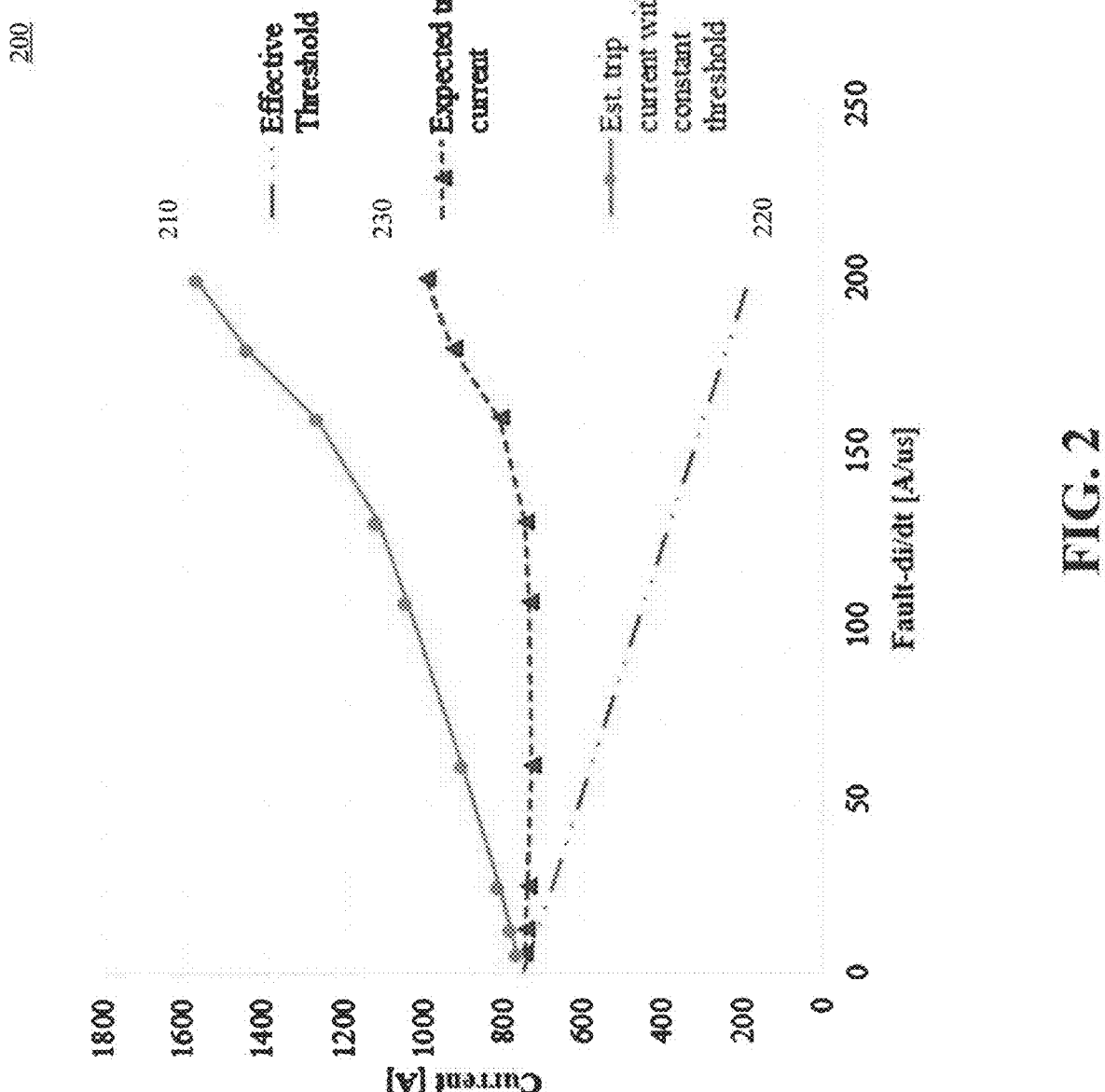

That is, as long as k is carefully matched so as to cancel the delay time $\delta t$, the peak fault current $I_{peak}$ in the SSCB remains constant over a wide range of fault di/dt. FIG. 2 shows a scenario of the hardware-based trip current threshold adjustment, namely an impact of the hardware-based trip current threshold adjustment versus a constant trip threshold. The plot 210 shows the estimated trip current threshold for the SSCB as a function of the fault di/dt without adjustment or compensation. The plot 220 shows that the trip current threshold reduces along the fault di/dt with a linear fault di/dt-based adjustment or compensation. The reduced trip current threshold cancels the impact of the control delay time on the peak fault current $I_{peak}$ in the SSCB. As a result, the effective peak fault current $I_{peak}$ remains constant over a wide range of fault di/dt, as shown through the plot 230.

However, even with the hardware-based trip current threshold adjustment, which ensures less delay in adjusting the trip current threshold 112 in response to changes of fault di/dt 113, as shown in FIG. 1, there are still two major problems associated with the conventional mixed-signal analog fault detection circuit 100. First, as noted above, a circuit for calibrating the fault di/dt that is composed of the differentiator 110 and the subtractor 114 can be easily affected by inaccuracies, signal distortions, and/or propagation delays caused by various components of the mixed-signal analog fault detection circuit 100. This is a particular issue when the fault di/dt is high. For example, the input to the differentiator, i.e., the filtered fault current represented by the signal $S_{filter}$ 108, is a signal multiplied by the transfer function of the sensor 104 and the transfer function of the filter 106, and further, is to be multiplied by the dynamics of the differentiator 110. The differentiator 110's output $Y_{diff}(s)$ can be written as follows:

$$Y_{diff}(s) = I_f(s)G_{cs}(s)G_{lpf}(s)G_{diff}(s) \tag{3}$$

where Gcs(s) is the transfer function of the sensor 104, Glpf(s) is the transfer function of the filter 106, Gdiff(s) is the transfer function of the differentiator 110, and $I_f(s)$ is the fault current signal in the Laplace domain.

Depending upon how high the fault di/dt becomes, the filtered fault current represented by the signal $S_{filter}$ 108 is phase-shifted and/or distorted through the sensor 104 and/or the filter 106. Accordingly, an output of the differentiator 110 is phase-shifted and/or distorted as well.

Figure 3:
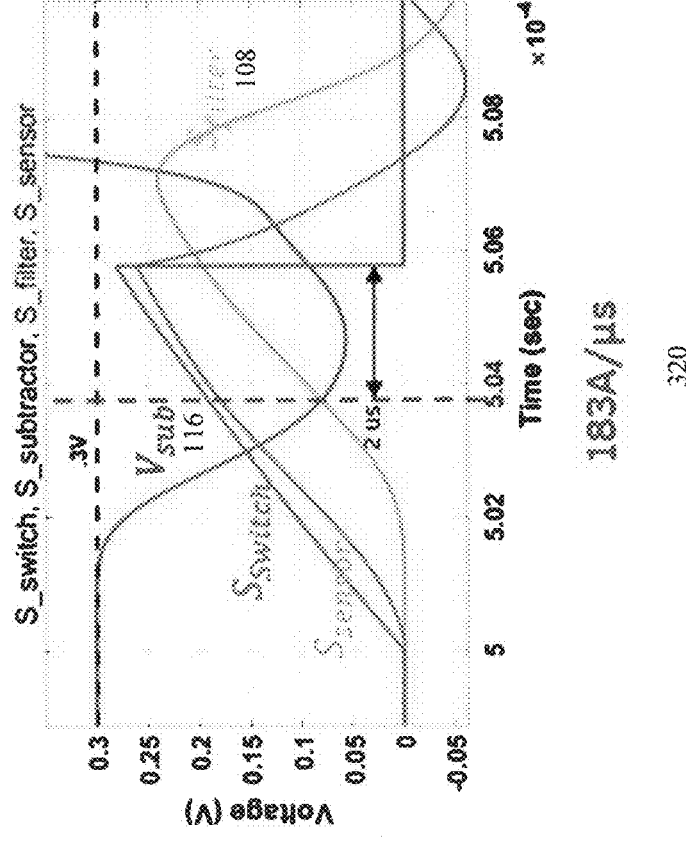
Figure 3:
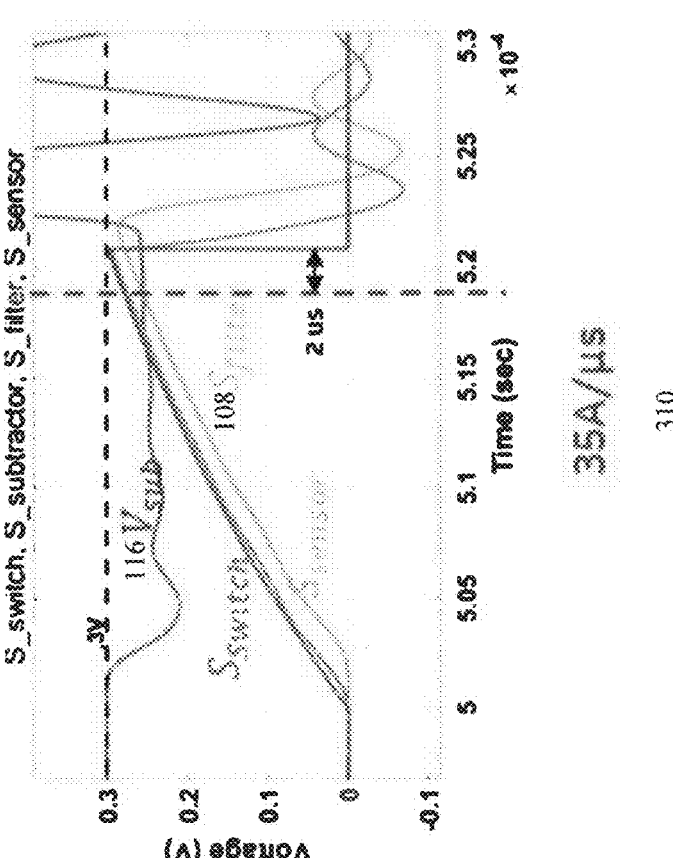

Further, as the fault di/dt increases, the time taken by the fault detection circuit 100 to detect the fault current becomes comparable to the settling time of the output of the differentiator, for example, the differentiator 110 as shown in FIG. 1, i.e., time required for the fault current to reach $V_{sub}$+delay time up to the $S_{filter}$ stage. This causes the output of the differentiator to reduce over high fault di/dt, which leads to inadequate adjustment or compensation of the trip current threshold at high fault di/dt. As shown in FIG. 3, at a fault di/dt of 35 A/µs, the signal $V_{sub}$ 116 of FIG. 1 provided to the comparator 118 has enough time to settle into a steady state value. The SSCB is tripped at the time when the signal $S_{filter}$ 108 of FIG. 1 also provided to the comparator 118 goes above the signal $V_{sub}$ 116. The fault current is then interrupted after a 2 µs gate driver delay. However, at a fault di/dt of 183 A/µ, the signal $V_{sub}$ 116 has not settled down to a steady value when the signal $S_{filter}$ 108 ramps up and exceeds the signal $V_{sub}$ 116. Accordingly, the fault detection circuit 100 makes an inaccurate fault di/dt adjustment or compensation for that specific fault di/dt. Additionally, the delay time is inadequately compensated. Both factors cause an increase of the peak fault current $I_{peak}$, at which the SSCB eventually interrupts the current.

Figure 4:
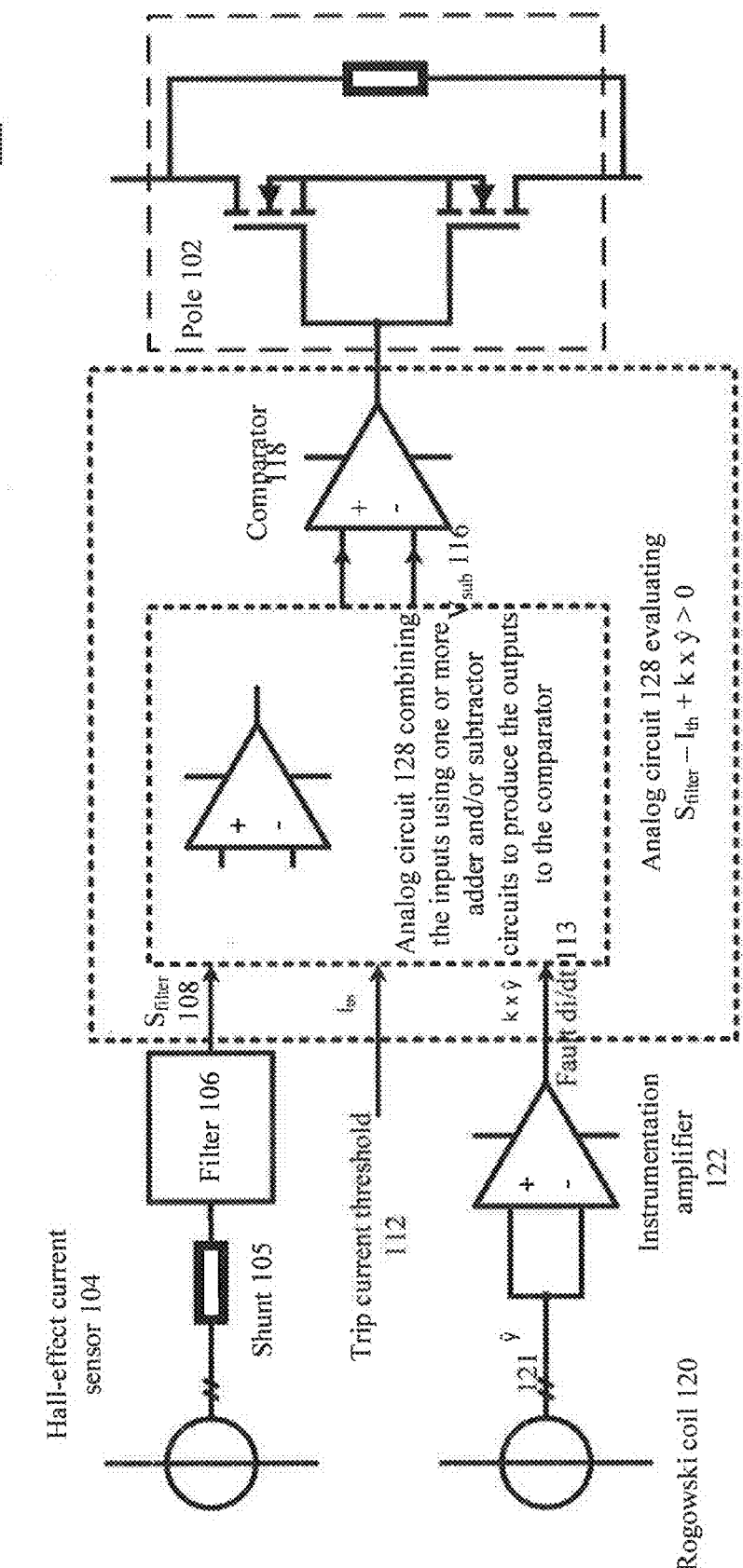
FIG. 4 is a schematic diagram of a mixed-signal analog fault detection circuit for detecting short circuit faults with an SSCB in a DC electrical system according to an exemplary embodiment of the present disclosure.

FIG. 4 is a schematic diagram of a mixed-signal analog fault detection circuit for detecting short circuit faults with an SSCB in a DC electrical system according to an exemplary embodiment of the present disclosure.

In an exemplary embodiment of the present disclosure, an external Rogowski coil 120 is installed for a mixed-signal analog fault detection circuit 400 to directly measure fault di/dt of a DC circuit or system. An output 121 of the Rogowski coil 120 provides a voltage proportional to the measured fault di/dt of the DC circuit or system. Since the measured fault di/dt is usually very small, the output 121 of the Rogowski coil 120 is delivered to an instrumentation amplifier 122. A gain of the instrumentation amplifier 122 is adjusted to match the measured fault di/dt to the trip current threshold 112 to obtain the fault di/dt 113. An analog circuit 128 is then able to make a reasonable adjustment of the trip current threshold 112 based on the fault di/dt 113, as shown in FIG. 4.

In some exemplary embodiments, in the event that the measured fault di/dt is sufficiently large or comparable to the trip current threshold 112, the measured fault di/dt delivered at the output 121 of the Rogowski coil 120 can be regarded as the fault di/dt 113, and be directly delivered to one of the inputs of the analog circuit 128. That is, the instrumentation amplifier 122 is not a necessary part of the fault detection circuit 400.

In some exemplary embodiments, the analog circuit 128 combines the inputs such as the trip current threshold 112, the fault di/dt 113, and the detected fault current $S_{filter}$ 108 by using one or more adders and/or subtractor circuits to produce outputs for the comparator 118. For example, the analog circuit 128 evaluates a value of the detected fault current $S_{filter}$ 108–the trip current threshold 112+the fault di/dt 113. The fault di/dt 113 may be represented by:

$$\text{the fault } di/dt\ 113 = k \times \text{the output 121 of the Rogowski coil 120} \quad (4)$$

where k is a parameter for adjusting the trip current threshold 112. For example, depending on whether any fault di/dt and/or how much fault di/dt is measured by the Rogowski coil 120, the comparator 118 compares the detected fault current of the DC circuit or system (signal $S_{filter}$ 108) measured by the Hall-effect current sensor 104 and the detected fault di/dt of the DC circuit and system (signal $V_{sub}$ 116), and accordingly, provides a tripping or non-tripping command to the SSCB through the pole 102.

As such, a Rogowski coil-based additional measurement is implemented for a mixed-signal analog fault detection circuit 400. By separately taking a fault di/dt measurement by a Rogowski coil 120 and a fault current measurement by a Hall-effect current sensor 104, reliability and accuracy of the fault detection circuit 400 is enhanced. Further, the additional measurement by the Rogowski coil achieves a faster fault detection compared to a single current sensor detection as the di/dt measurement is made directly on the fault current instead of the output of the filter, $S_{filter}$. Furthermore, a second current sensor, i.e., the Rogowski coil 120, increases redundancy in case the first current sensor, i.e., the Hall-effect current sensor 104, fails to perform.

In addition, the Rogowski coil 120 can be a commercially available Rogowski coil. The commercially available Rogowski coil can be integrated into the Hall-effect current sensor 104 and the fault detection circuit 400 through an installation on a main busbar or a main current path of the SSCB pole 102, and an output of the Rogowski coil can be connected to the fault detection circuit 400 as shown in FIG. 4.

Figure 5:
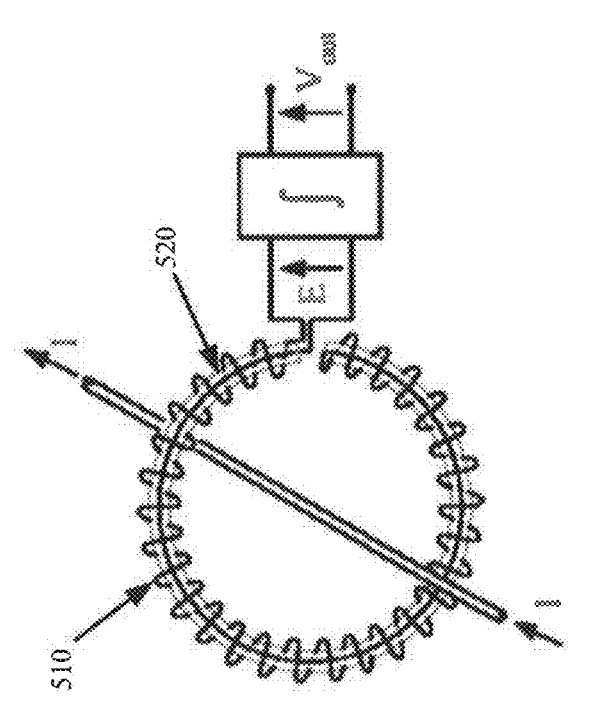
FIG. 5 is a schematic diagram of the internal structure of an exemplary Rogowski coil current sensor.

FIG. 5 shows an example of the internal structure of a commercially available Rogowski coil. As shown, a coil 510 is wound around a non-magnetic former 520, and used to measure fault di/dt. In general, a voltage $V_{out}$ is induced in the coil. This voltage $V_{out}$ is proportional to the rate of change of current in a DC circuit or system. That is, the voltage $V_{out}$ is proportional to the fault di/dt of the DC circuit or system.

In some exemplary embodiments, the external Rogowski coil 120 is designed as a printed circuit board (PCB) with a window that allows the main busbar of the SSCB pole 102 to pass through it. An output of such PCB-designed Rogowski coil is provided to the mixed-signal analog fault detection circuit 400, as shown in FIG. 4. Accordingly, an integrated fault current and fault di/dt sensor, with fault current measurement using a Hall-effect current sensor and fault di/dt measurement using a PCB-designed Rogowski coil, is provided.

Figure 6:
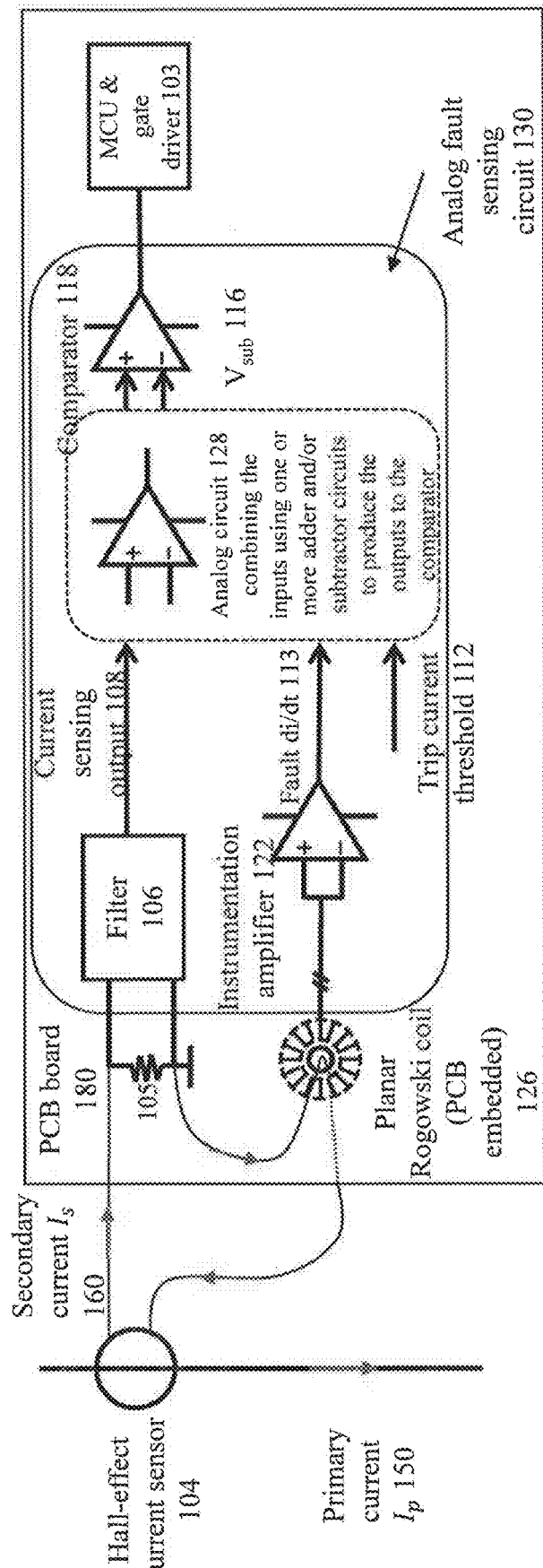
FIG. 6 is a schematic diagram of a mixed-signal analog fault detection circuit for detecting short circuit faults with an SSCB in a DC electrical system according to an embodiment of the present disclosure.

FIG. 6 is a schematic diagram of a mixed-signal analog fault detection circuit for detecting short circuit faults with an SSCB in a DC electrical system according to an embodiment of the present disclosure. As shown in FIG. 6, a Rogowski coil is embedded into a mixed-signal analog fault detection circuit 600 for the DC electrical system. In an exemplary embodiment, the Rogowski coil providing the additional fault di/dt measurement may be an embedded printed circuit board (PCB) design. That is, a Rogowski coil, for example, a planar Rogowski coil is embedded in the PCB for a fault di/dt measurement. In this solution, the embedded Rogowski coil measures a fault di/dt of a secondary current of an external Hall-effect current sensor 104. As shown in FIG. 6, a planar Rogowski coil 126 is embedded into the same PCB 180 that carries the signal conditioning integrated circuit (IC) for the fault detection circuit 600.

Figure 7:
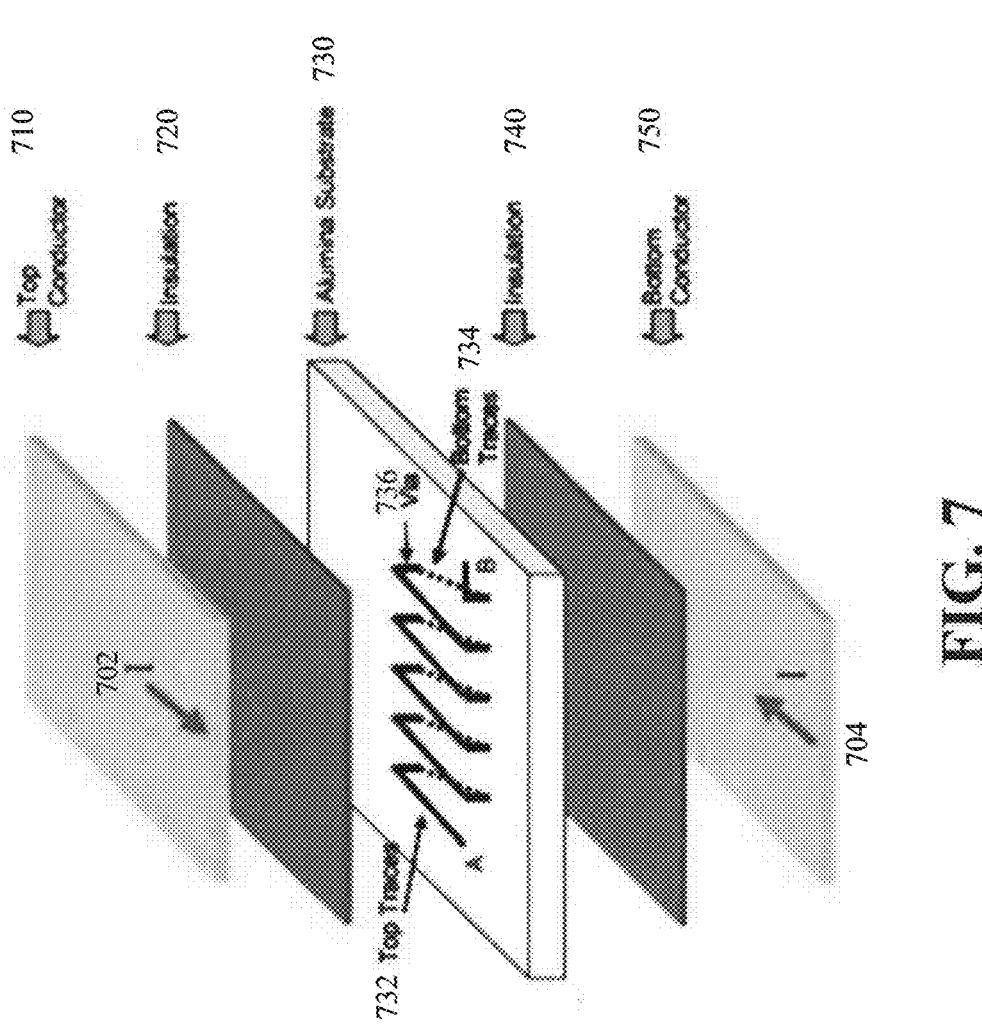
FIG. 7 is a schematic diagram of an exemplary Rogowski coil current sensor having planar structure.

FIG. 7 is an example of a Rogowski coil current sensor having a planar structure. The illustrated planar Rogowski coil 126, is developed and improved upon from a conventional Rogowski coil current sensor structure, where coils are wound around a non-magnetic former, as shown in FIG. 5. The planar Rogowski coil uses PCB traces as coil turns, for example, top traces 732 and bottom traces 734 as shown in FIG. 7. The planar Rogowski coil uses electrical vias, for example, via 736 as shown in FIG. 7 to interconnect these PCB traces. The planar Rogowski coil further uses a flame retardant 4 (FR4) substrate as the non-magnetic former, for example, the alumina substrate 730 as shown in FIG. 7. An input current (702 or 704) and an output current (704 or 702) flow through the top conductor 710 and an upper insulation layer 720 located above the alumina substrate 730, the alumina substrate 730, and a lower insulation layer 740 and bottom conductor 750 located under the alumina substrate 730. As shown, the planar structure enables a Rogowski coil to be embedded into the same PCB that carries the signal conditioning IC.

Referring back to FIG. 6, the PCB 180 includes a shunt resistor 105 in parallel to a filter 106 to receive fault di/dt values of a secondary output current $I_s$ 160 from an external Hall-effect current sensor 104. The filter 106 filters out high frequency transients or noises of the secondary output current $I_s$ 160, and delivers a current sensing output 108 ($S_{filter}$ 108) to a first input of a comparator 118. This secondary output current $I_s$ 160 from the external Hall-effect current sensor 104 is also delivered to the planar Rogowski coil 126.

For example, the external Hall-effect current sensor 104 measures a primary current $I_p$ 150, and the output of the external Hall-effect current sensor 104 delivers the secondary output current $I_s$ 160 to the signal-conditioning PCB 180. This secondary output current $I_s$ 160 then goes through a center hole of the planar Rogowski coil 126 for measuring fault di/dt. The same secondary output current $I_s$ 160 flows through the shunt resistor 105 for a sensing result of the external Hall-effect current sensor 104. That is, the secondary output current $I_s$ 160 is used twice for both fault current detection and fault di/dt detection.

As shown in FIG. 6, an output of the planar Rogowski coil 126 is scaled by an instrumentation amplifier 122 to a fault di/dt 113 that is comparable to a trip current threshold 112. Additionally and/or alternatively, the output of the planar Rogowski coil 126 is first inputted into an integrator, which accumulates the input measured fault di/dt over a defined time and produces a representative output. This output from the integrator is then delivered to another instrumentation amplifier as a backup for the current measurement taken by the Hall-effect current sensor 104.

Accordingly, a reasonable adjustment to the trip current threshold 112 through an analog circuit 128 can be made based on the fault di/dt 113. An output of the analog circuit 128, i.e., the di/dt sensing output 116 ($V_{sub}$ 116), is delivered to a second input of the comparator 118. The comparator 118 then compares current sensing output 108 ($S_{filter}$ 108) with the di/dt sensing output 116 ($V_{sub}$ 116) to make a tripping or non-tripping decision for the SSCB.

This decision is provided to the SSCB through a gate driver 103 and then a pole 102 for the SSCB. The gate driver 103 enables the SSCB to be efficiently turned on or turned off. Additionally and/or alternatively, this decision can be provided to a microcontroller (MCU), which generates a tripping command to the SSCB.

In some exemplary embodiments, the filter 106, the instrumentation amplifier 122, the analog circuit 128, and the comparator 118 are included as an analog fault sensing circuit 130, as shown in FIG. 6. Within this analog fault sensing circuit 130, the analog circuit 128 combines the inputs, for example, the current sensing output 108 ($S_{filter}$ 108), the fault di/dt 113 and the trip current threshold 112, using one or more adders and/or subtractor circuits to produce the outputs to the comparator 118.

In some exemplary embodiments, the current sensing output 108 ($S_{filter}$ 108) obtained after the secondary output current $I_s$ 160 flowing through the filter 106 is delivered to a microcontroller through its ADC. The microcontroller then performs a software-based trip protection and telemetry. For example, the fault di/dt 113, i.e., di/dt sensing data, will be subtracted from the trip current threshold 112, i.e., an analog trip current threshold through the analog circuit 128. The resultant signal from the analog circuit 128 is compared with the current sensing output 108 ($S_{filter}$ 108), and accordingly, a fault interruption command is issued to the SSCB pole 102 through the gate driver 103.

In some exemplary embodiments, the instrumentation amplifier 122 may not be included in the fault detection circuit 600 as long as the measured fault di/dt by the planar Rogowski coil 126 is sufficiently comparable to the trip current threshold 112. Under this scenario, the measured fault di/dt by the planar Rogowski coil 126 is the fault di/dt 113. Accordingly, a reasonable adjustment of the trip current threshold 112 can be made through the analog circuit 128 according to the fault di/dt 113.

As such, a PCB-based Rogowski coil is embedded onto the PCB of the fault detection circuit 600. This solution achieves minimal form factor usage. For example, the size of the PCB-based Rogowski coil may be made more compact and smaller. In addition, this solution is lower cost and provides less intrusive measurements to the primary current loop, compared to the solution that simply adds a Rogowski coil current sensor, either a conventional Rogowski coil or a Rogowski coil designed as a PCB. For example, when a current on a secondary side of a current sensor is measured, a primary current busbar does not need to be designed in such a way having a second sensor installed on or added to it. Accordingly, no special changes need to be made to the primary current busbar to accommodate an extra current sensor.

In addition, a PCB-based Rogowski coil embedded onto the PCB of the fault detection circuit 600 allows various designs of the Rogowski coil for different applications. This is not possible with commercially available Rogowski coils. For example, by adjusting the parameters and/or dimensions of parasitic components of the PCB-based Rogowski coil, desired transfer functions of the Rogowski coil can be controlled for the PCB of the fault detection circuit 600 embedded with the Rogowski coil.

Figure 8:
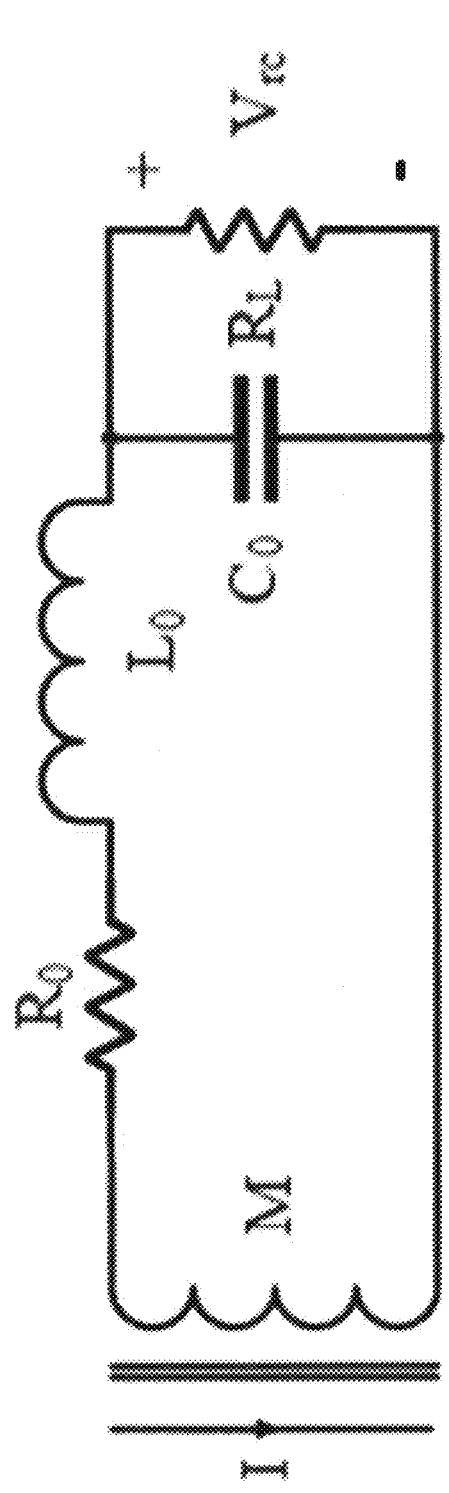
FIG. 8 is a schematic diagram of a simplified model of a Rogowski coil current sensor having parasitic components.

FIG. 8 is a schematic diagram of a simplified model of a Rogowski coil current sensor having parasitic components. As shown in FIG. 8, a simplified model of a Rogowski coil 800 includes parasitic components such as mutual inductance M, a resistor $R_0$, an inductor $L_0$, and a capacitor $C_0$ connected in series, with the capacitor $C_0$ further connected to a load resistor $R_L$ in parallel. The illustrated Rogowski coil is basically a differentiator, however, it relies on Maxwell's laws of electromagnetism to calculate fault di/dt. For example, a voltage generated by the Rogowski coil can be expressed as follows:

$$V_{rc} = M\frac{dI}{dt} \tag{5}$$

where the mutual inductance M between the current carrying conductor and the Rogowski coil determines a coupling coefficient between the di/dt and the voltage outputted by the Rogowski coil.

While Equation (5) represents an ideal scenario, a detailed transfer function of the Rogowski coil is given as follows:

$$G_{rc}(s) = \frac{Ms}{L_0 C_0 s^2 + \left(\frac{L_0}{R_L} + R_0 C_0\right)s + \left(\frac{R_0}{R_L} + 1\right)} \tag{6}$$

The transfer function of the Rogowski coil has a zero at the origin, and a pair of complex conjugate poles in the left half plane, i.e., the real component of the pole is negative. As expressed in Equation (6), the values of $R_0$, $C_0$, and $L_0$ depend on the physical dimensions of the Rogowski coil, and thus, the physical dimensions and values of $R_0$, $C_0$, and $L_0$ can be controlled to obtain a desired transfer function $G_{rc}(s)$.

FIGS. 9($a$) and 9($b$) are Bode plots of a gain of an exemplary Rogowski coil current sensor. As shown, a variation of gain magnitude and phase plots is obtained with changes of the parasitic components, $R_0$, $C_0$, and $L_0$, associated with the Rogowski coil. For example, FIG. 9($a$) shows, with the change of $R_0$ values (10 Ohm, 60 Ohm, and 120 Ohm), the corresponding changes of gain magnitude in dB and phase in degrees. For example, FIG. 9($b$) shows, with the change of $C_0$ values (2.2 nF, 22 nF, and 220 nF), the corresponding changes of gain magnitude in dB and phase in degrees.

As described with reference to FIG. 6, the output of the Rogowski coil is subtracted from the analog trip current threshold 112 through the analog circuit 128 in the fault detection circuit 600 for the SSCB. Or alternatively, the output of the Rogowski coil can be given to an instrumentation amplifier, such as the instrumentation amplifier 122 shown in FIG. 6, to match the output with the analog trip current threshold 112.

As also described with reference to FIG. 6, the current signal measured by the Hall-effect current sensor 104, i.e., the secondary output current $I_s$ 160, is delivered to the planar Rogowski coil 126 and the analog filter 106. These two signals are compared through the comparator 118. Accordingly, a decision to trip the SSCB is made upon the fault current exceeding the fault di/dt adjusted trip current threshold.

In some exemplary embodiments, the Rogowski coil can be replaced with an inductor $L_1$. Accordingly, the control law indicated in Equation (5) changes to an equation expressed as follows:

$$V_L = L_1 \frac{dI}{dt} \tag{7}$$

FIG. 10 is an example of a hardware configuration for a PCB-based planar Rogowski coil that is embedded into a mixed-signal analog fault detection circuit 600 as shown in FIG. 6.

As shown in FIG. 10 with reference to FIG. 6, the external Hall-effect current sensor 104 measures the primary current $I_p$ 150 flowing through the thick power cables 1020. The external Hall-effect current sensor 104's output is a secondary output current $I_s$ 160 flowing through a jumper wire loop 1050 to a signal-conditioning PCB 180. For example, the jumper wire loop 1050 goes through the center of the planar Rogowski coil via a through-hole installation 1150 of the PCB 180. The same jumper wire loop 1050 then connects to the terminal 1010 of the PCB 180 and flows through a shunt resistor 105 connected in parallel to a filter 106 for the Hall-effect sensor current sensing results.

As shown in FIG. 10 with reference to FIG. 6, the secondary output current $I_s$ 160 outputted from the external Hall-effect current sensor 104 is used for both the planar Rogowski coil 126 fault di/dt sensing and the shunt resistor 105/the filter 106 fault current sensing. This design provides a secondary output current that is scaled down from the primary fault current measured by the external Hall-effect current sensor 104 and directly usable for the fault detection circuit 600. Accordingly, it achieves minimal form factor usage and is lower cost.

Further, as also shown in FIG. 10 with reference to FIG. 6, the planar Rogowski coil 104 and the shunt resistor 105/the filter 106 are embedded into the PCB 180. This design enables less intrusive measurements to the primary current loop, i.e., the primary fault current measurements by the external Hall-effect current sensor 104.

FIG. 11 shows another exemplary embodiment of a mixed-signal analog fault detection circuit for fast detection of short circuit faults with an SSCB. For example, the SSCB is a DC SSCB. As shown, FIG. 11 is similar to FIG. 4, except the external Rogowski coil 120 is replaced by an external inductor 124. That is, fault di/dt measurements are conducted by a calibrated inductor 124.

In general, the inductor 124 develops a voltage across it when connected to a DC circuit or system. This voltage is a multiplication of the inductor 124's inductance and the fault di/dt. In other words, this voltage provides a measurement that is proportional to the fault di/dt.

Once the fault di/dt is measured or obtained from the inductor 124, the rest of the processes, such as adjusting or compensating the trip current threshold 112 and making a decision to trip the SSCB based on a comparison between the measured fault current and the adjusted trip current threshold, are the same as described according to FIG. 4.

For example, the voltage, i.e., an output of the calibrated inductor 124 is delivered to the instrumentation amplifier 122. The gain of the instrumentation amplifier 122 may be adjusted based on a value of the output of the calibrated inductor 124 to match a value of the trip current threshold 112. The matched value of the output of the calibrated inductor 124, namely, the fault di/dt 113 outputted by the instrumentation amplifier 122, is delivered to the subtractor 114. The subtractor 114 is then able to make a reasonable adjustment of the trip current threshold 112 based on the fault di/dt 113.

Additionally and/or alternatively, the output of the calibrated inductor 124 may be regarded as the fault di/dt 113, and directly delivered to the subtractor 114.

For example, the comparator 118 compares the detected fault current of the DC circuit or system, represented by signal $S_{filter}$ 108, measured by the Hall-effect current sensor 104 and the detected fault di/dt of the DC circuit and system, represented by signal $V_{sub}$ 116, measured by the calibrated inductor 124. Accordingly, the comparator 118 is able to provide a tripping or non-tripping command to the SSCB through the pole 102.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure.

Exemplary embodiments of the present disclosure are described herein, including the best mode known to the inventors for carrying out the disclosure. Variations of those exemplary embodiments may become apparent to those of ordinary skill in the art upon reading the foregoing description. The inventors expect skilled artisans to employ such variations as appropriate, and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. An electrical circuit for detecting short circuit faults with a solid-state circuit breaker (SSCB), comprising:
   a first sensor configured to detect a fault current of an electrical system, wherein the first sensor is configured for installation on a main current path of an SSCB pole;
   a second sensor configured to detect a derivative of the fault current of the electrical system with respect to time, wherein the second sensor is configured for installation on the main current path of the SSCB pole; and
   an analog circuit, wherein an output of the first sensor and an output of the second sensor are connected to the analog circuit.

2. The electrical circuit of claim 1, wherein the second sensor is a Rogowski coil current sensor.

3. The electrical circuit of claim 2, wherein the Rogowski coil current sensor is designed as a printed circuit board (PCB), and wherein the PCB comprises a window, which the main current path of the SSCB pole passes through.

4. The electrical circuit of claim 1, wherein the second sensor is an inductor.

5. The electrical circuit of claim 1, wherein the first sensor is a Hall-effect current sensor.

6. The electrical circuit of claim 1, wherein the analog circuit comprises a subtractor and/or an adder that combines the output of the first sensor, the output of the second sensor, and a trip current threshold to evaluate whether a sum of the outputs of the first and second sensors exceeds the trip current threshold.

7. The electrical circuit of claim 6, wherein an output of the subtractor and/or the adder delivers an adjusted trip current threshold based on the derivative of the fault current with respect to time.

8. The electrical circuit of claim 7, wherein the analog circuit further comprises a comparator that determines whether the fault current exceeds the adjusted trip current threshold, based on which a decision to trip the SSCB is made.

9. The electrical circuit of claim 1, wherein the analog circuit further comprises an instrumentation amplifier, wherein a gain of the instrumentation amplifier is adjusted based on the derivative of the fault current with respect to time to increase or decrease a compensation for the derivative of the fault current with respect to time.

10. An electrical circuit on a printed circuit board (PCB) for detecting short circuit faults with a solid-state circuit breaker (SSCB), wherein the electrical circuit is configured for connection to a first sensor configured to detect a fault current of an electrical system, comprising:

a second sensor configured to detect a derivative of the fault current with respect to time of the electrical system, wherein the second sensor is connected to a main current path of an SSCB pole; and
an analog circuit, wherein an output of the first sensor and an output of the second sensor are connected to the analog circuit.

11. The electrical circuit on the PCB of claim 10, wherein the second sensor is a Rogowski coil current sensor.

12. The electrical circuit on the PCB of claim 11, wherein the Rogowski coil current sensor is designed as a PCB-based Rogowski coil current sensor, and embedded into the electrical circuit on the PCB, and wherein the PCB-based Rogowski coil current sensor is customized to detect a derivative of a secondary fault current output of the first sensor with respect to time.

13. The electrical circuit on the PCB of claim 11, wherein the Rogowski coil current sensor is a planar Rogowski coil current sensor.

14. The electrical circuit on the PCB of claim 10, wherein the first sensor is a Hall-effect current sensor.

15. The electrical circuit on the PCB of claim 10, wherein the analog circuit comprises a subtractor and/or an adder that combines the output of the first sensor, the output of the second sensor, and a trip current threshold to evaluate whether a sum of the outputs of the first and second sensors exceeds the trip current threshold.

16. The electrical circuit on the PCB of claim 15, wherein an output of the subtractor and/or the adder delivers an adjusted trip current threshold based on the derivative of the fault current with respect to time.

17. The electrical circuit on the PCB of claim 16, wherein the analog circuit further comprises a comparator that determines whether the fault current exceeds the adjusted trip current threshold, based on which a decision to trip the SSCB is made.

18. The electrical circuit on the PCB of claim 10, wherein the analog circuit further comprises an instrumentation amplifier, wherein a gain of the instrumentation amplifier is adjusted based on the derivative of the fault current with respect to time to increase or decrease a compensation for the derivative of the fault current with respect to time.

19. The electrical circuit on the PCB of claim 10, further comprising an integrator that accumulates the derivative of the fault current with respect to time detected by the second sensor over a defined time and produces a representative output as a backup current for the fault current detected by the first sensor.

20. A method for adjusting a trip current threshold for an electrical circuit for detecting short circuit faults with a solid-state circuit breaker (SSCB), comprising:
   detecting a fault current using a first sensor;
   detecting a derivative of the fault current with respect to time using a second sensor;
   evaluating whether a sum of the detected fault current and the detected derivative of the fault current with respect to time exceeds the trip current threshold to obtain an adjusted trip current threshold;
   comparing the detected fault current with the adjusted trip current threshold; and
   making a tripping decision for the SSCB based on a result of the comparison.

* * * * *